United States Patent
Zhang et al.

(10) Patent No.: US 9,311,992 B2
(45) Date of Patent: Apr. 12, 2016

(54) DECODING SYSTEM AND METHOD FOR ELECTRONIC NON-VOLATILE COMPUTER STORAGE APPARATUS

(71) Applicant: LSI Corporation, San Jose, CA (US)

(72) Inventors: Fan Zhang, Milpitas, CA (US); Yu Chin Fabian Lim, San Jose, CA (US); Shu Li, San Jose, CA (US)

(73) Assignee: Seagate Technology, Cupertino, CA (US)

( * ) Notice: Subject to any disclaimer, the term of this patent is extended or adjusted under 35 U.S.C. 154(b) by 33 days.

(21) Appl. No.: 14/200,659

(22) Filed: Mar. 7, 2014

(65) Prior Publication Data

US 2015/0227403 A1    Aug. 13, 2015

Related U.S. Application Data

(60) Provisional application No. 61/937,040, filed on Feb. 7, 2014.

(51) Int. Cl.

| | |
|---|---|
| *G06F 11/10* | (2006.01) |
| *G11C 11/56* | (2006.01) |
| *H03M 13/11* | (2006.01) |
| *H03M 13/37* | (2006.01) |
| *H03M 13/45* | (2006.01) |
| *H03M 13/00* | (2006.01) |
| *G06F 11/36* | (2006.01) |

(52) U.S. Cl.
CPC ........ *G11C 11/5642* (2013.01); *G06F 11/1008* (2013.01); *G06F 11/1012* (2013.01); *H03M 13/1105* (2013.01); *H03M 13/373* (2013.01); *H03M 13/3723* (2013.01); *H03M 13/451* (2013.01); *H03M 13/6325* (2013.01)

(58) Field of Classification Search
CPC .............. G06F 11/076; G06F 11/1068; G06F 11/1072; G06F 11/1076; G06F 11/1008; H04L 1/20; H04L 1/24; H04L 1/0009; H04L 1/0057; H03M 13/2957; H03M 13/45; G11C 11/5642
See application file for complete search history.

(56) References Cited

U.S. PATENT DOCUMENTS

| | | | |
|---|---|---|---|
| 6,182,261 B1 * | 1/2001 | Haller et al. | ................. 714/758 |
| 7,388,781 B2 | 6/2008 | Litsyn et al. | |
| 7,643,342 B2 | 1/2010 | Litsyn et al. | |
| 7,656,707 B2 | 2/2010 | Kozlov | |

(Continued)

OTHER PUBLICATIONS

Amir Bennatan, Belief-Propagation Decoding of LDPC Codes, Princeton University, Mar. 27, 2008, 16 pages, Found online at: http://www.tsc.uc3m.es/~fernando/BP_LDPC.pdf.

*Primary Examiner* — April Y Blair
*Assistant Examiner* — Dipakkumar Gandhi
(74) *Attorney, Agent, or Firm* — Suiter Swantz pc llo

(57) ABSTRACT

Methods are systems for calculating log-likelihood ratios for a decoder utilized in an electronic non-volatile computer storage apparatus are disclosed. A log-likelihood ratio handler is configured to provide an input log-likelihood ratio to the decoder, wherein the input log-likelihood ratio is one of: a uniform input log-likelihood ratio for all bits calculated based on an estimated raw bit error rate for a particular data unit, or a bit-based input log-likelihood ratio for each bit calculated based on a confidence value for a cell containing said each bit. The decoder of the electronic non-volatile computer storage apparatus is configured to decode encoded data at least partially based on the input log-likelihood ratio from the log-likelihood ratio handler.

20 Claims, 2 Drawing Sheets

(56) References Cited

U.S. PATENT DOCUMENTS

| | | |
|---|---|---|
| 7,805,663 B2 | 9/2010 | Brandman et al. |
| 8,429,500 B2 | 4/2013 | Haratsch et al. |
| 8,458,563 B2 | 6/2013 | Sharon et al. |
| 2003/0154435 A1* | 8/2003 | Claussen et al. ............... 714/755 |
| 2009/0282316 A1* | 11/2009 | Lingam et al. ................ 714/763 |
| 2014/0157086 A1* | 6/2014 | Sharon et al. ................. 714/773 |

* cited by examiner

DECODING SYSTEM AND METHOD FOR ELECTRONIC NON-VOLATILE COMPUTER STORAGE APPARATUS

CROSS-REFERENCE TO RELATED APPLICATIONS

The present application claims the benefit under 35 U.S.C. §119(e) of U.S. Provisional Application Ser. No. 61/937,040, filed Feb. 7, 2014. Said U.S. Provisional Application Ser. No. 61/937,040 is hereby incorporated by reference in its entirety.

TECHNICAL FIELD

The present invention relates to the field of flash memory and particularly to the flash memory decoding process.

BACKGROUND

Flash memory is an electronic non-volatile computer storage apparatus that can be electrically erased and reprogrammed. There are two main types of flash memory, which are named after the NAND and NOR logic gates. In NAND flash memory, cells are organized by word-lines and bit-lines into blocks. A block has a large number of cells (e.g., hundreds of thousands of cells). NAND flash memory may be written and read in blocks or pages which are generally much smaller than the entire device.

SUMMARY

Accordingly, an embodiment of the present disclosure is directed to a method for providing an input log-likelihood ratio to a decoder of an electronic non-volatile computer storage apparatus. The method includes the steps of: estimating a raw bit error rate for a particular data unit; calculating the input log-likelihood ratio based on the estimated raw bit error rate; and providing the calculated input log-likelihood ratio to the decoder for decoding data from that particular data unit.

A further embodiment of the present disclosure is also directed to a method for providing an input log-likelihood ratio to a decoder of an electronic non-volatile computer storage apparatus. The method includes the steps of: waiting for at least one decoding iteration; after said at least one decoding iteration, calculating a bit-based input log-likelihood ratio for each bit based on a confidence value for a cell containing said each bit; and providing the calculated bit-based input log-likelihood ratio for each bit to the decoder for a subsequent decoding iteration.

An additional embodiment of the present disclosure is directed to an electronic non-volatile computer storage apparatus. The electronic non-volatile computer storage apparatus includes an encoder configured to encode data written to the electronic non-volatile computer storage apparatus, a storage module configured to store encoded data from the encoder, and a log-likelihood ratio handler configured to provide an input log-likelihood ratio to a decoder. The input log-likelihood ratio provided by the log-likelihood ratio handler is one of: a uniform input log-likelihood ratio for all bits calculated based on an estimated raw bit error rate for a particular data unit, or a bit-based input log-likelihood ratio for each bit calculated based on a confidence value for a cell containing said each bit. The decoder of the electronic non-volatile computer storage apparatus is configured to decode the encoded data at least partially based on the input log-likelihood ratio from the log-likelihood ratio handler.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Flash memory stores information in an array of memory cells made from floating-gate transistors. In traditional single-level cell (SLC) devices, each cell stores only one bit of information. Newer flash memory, known as multi-level cell (MLC) devices, including triple-level cell (TLC) devices, can store more than one bit per cell by choosing between multiple levels of electrical charge to apply to the floating gates of its cells.

Figure 1:
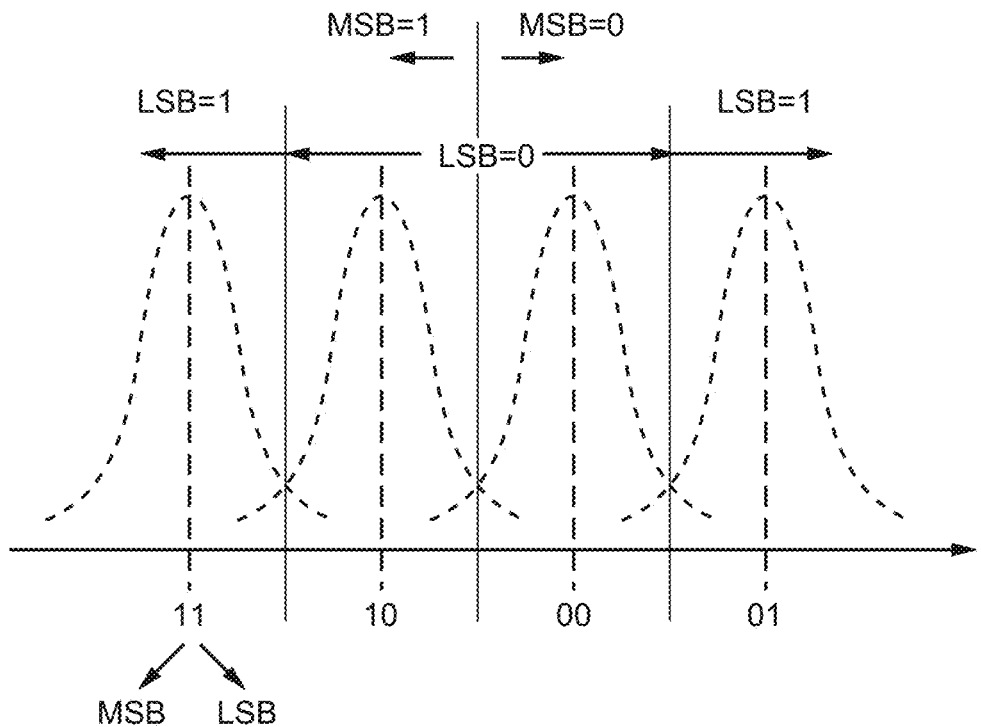
FIG. 1 is an illustration depicting various cell levels for storing the most significant bit and the least significant bit.

FIG. 1 is an illustration depicting various cell levels. A SLC has 2 target cell levels, corresponding to 1 and 0. A MLC (using 2 bits per cell) has 4 target cell levels to store the Most Significant Bit (MSB) and the Least Significant Bit (LSB). It is noted that due to the way MSB/LSB is stored in each cell, MSB has a lower noise level than LSB, and error events are correlated between the MSB and LSB (an MSB/LSB is in error implies the LSB/MSB from the same cell is in error with high probability). It is also noted that since a MSB/LSB page stores the MSBs/LSBs from multiple cells, MSB pages also have lower noise level than LSB pages.

More levels in a cell means finer voltage threshold in programming and read back, which also make MLC/TLC devices prune to noises. Stronger error correcting codes such as BCH code, low-density parity-check (LDPC) code, polar code and the like with soft decoding are commonly needed for MLC/TLC devices.

A soft decoding process generally uses a log-likelihood ratio (LLR) obtained through multiple measurements of a cell level. Taking multiple measurements significantly slows down the read throughput, and therefore soft decoding is generally only used for retries. Online error correction still uses hard decoding, also referred to as hard-decision decoding, which operates on data that take on a fixed set of possible values (typically 0 or 1 in a binary code).

It is noted, however, that existing hard decoders are not optimized for any particular error correcting code that is utilized. Take SLC for example, only hard decisions are provided to the decoder from cell-level measurements, but the actual LLR is unknown to the decoder. If low-density parity-check (LDPC) codes are utilized, for example, the lack of LLR information will degrade LDPC codes' performance to be similar to that of BCH codes. Furthermore, in a conventional hard decoding process, according to the measurement, +C (for a hard decision=1) and −C (for a hard decision=0), C being a constant, are passed to a Belief-Propagation (BP) decoder or a Min-Sum (MS) decoder for further process, but all bits get the same LLR magnitude as channel a priori.

Embodiments of the present disclosure are directed to hard decoder enhancement schemes that improve performance without slowing down throughput or needing to take multiple measurements of cell voltages. More specifically, three LLR handling techniques are disclosed for handling input LLR values very carefully in order to improve performance. Each of these techniques will be described in details.

In accordance with one embodiment of the present disclosure, a better C value is calculated and used for all bits with the goal of making the input to the decoder (e.g., a BP decoder) to be the estimation of the LLR given the channel observation y (for hard decoding, y equals 0 or 1). More specifically, let LLR be calculated as follows:

$$LLR = \log \frac{P_r(0|y)}{P_r(1|y)}$$

If an all-0 sequence is written, LLR is equal to:

$$LLR = \log \frac{P_r(0|y=1)}{P_r(1|y=1)}$$
$$= \log \frac{BER}{1-BER}$$

The equation above means that the C value (the constant that is to be passed to the decoder) can be calculated as a function of raw Bit Error Rate (BER) of a given data unit (e.g., a line, a page, a block or the like), and $$\log \frac{BER}{1-BER}$$

should be passed for y=0 and $$-\log \frac{BER}{1-BER}$$

should be passed for y=1 for that particular data unit.

It is contemplated that the BER can be estimated utilizing various techniques. For instance, the BER can be estimated by comparing converged data with the channel observations y for a particular data unit. That is, the decoder can run for a few iterations and the decoder data can be observed and used for estimation purposes to calculate the BER estimation. Alternatively, a fixed, known sequence can be written into the flash memory, and this sequence can be read back to estimate the BER before decoding starts. It is understood that other BER estimation techniques may also be utilized without departing from the spirit and scope of the present disclosure.

It is also noted that since BER changes from one data unit to the next, especially from LSB to MSB in MLC/TLC, estimating the BER for each particular data unit (based on converged data within the same unit) is therefore important and necessary. It is also noted that while the C value calculated as describe above may not necessarily be the optimum value, it is close to the optimum value and can be used in practice as is for a BP decoder.

Figure 2:
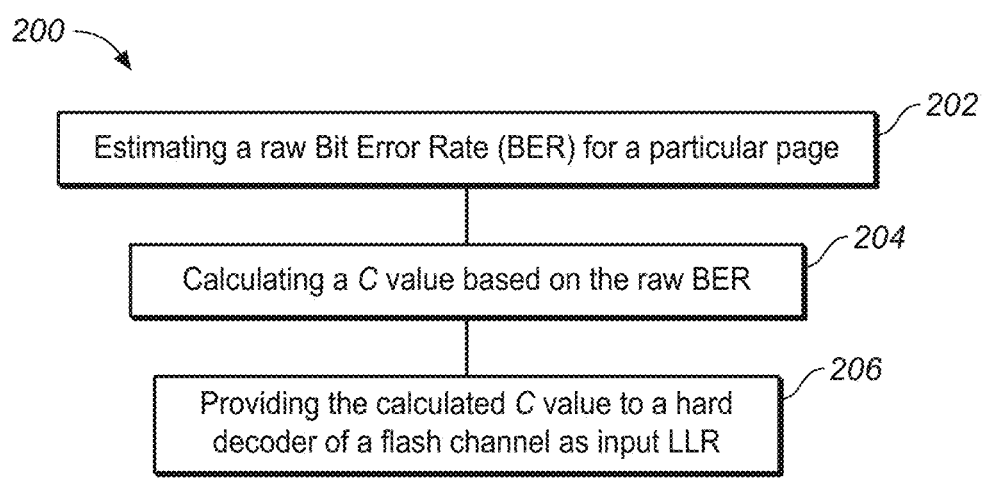
FIG. 2 is a flow diagram illustrating a method for providing an input LLR to a hard decoder of a flash channel.

Referring now to FIG. 2, a flow diagram illustrating a method 200 for providing an input LLR as the C value to a hard decoder of a flash channel is shown. In the embodiment illustrated in FIG. 2, each data unit corresponds to a particular page, and a raw BER is estimated for each page in step 202. Once the raw BER is estimated, the C value is subsequently calculated based on the raw BER in step 204. In one embodiment, the raw BER is estimated by comparing converged data with the channel observations for that particular page, and the C value is calculated as $$C = \log \frac{BER}{1-BER}.$$

The calculated C value is then used for all bits within the same page and passed to the hard decoder of the flash channel in step 206 for hard decoding. It is contemplated that the same process as described above is applicable to other data unit levels, such as lines or blocks.

Now, instead of using the same C value for all bits in a page as described above, alternative/additional embodiments of the present disclosure are configured to calculate and use different C values for different bits. For instance, decoder internal total LLR can be used starting at the second local iteration to estimate and/or compensate C values with the goal of making the input to the decoder (e.g., a BP decoder or a MS decoder) to be the estimation of the LLR given the cell voltage $u_{ch}$ (a real number). In other words, a bit-based input LLR for each bit is calculated based on a collective confidence value for the cell containing that bit. More specifically, for a decoder that implements iterative message passing, let message update (e.g., BP message update) on variable nodes to be calculated as follows:

$$v_j = u_{ch} + \sum_{i=0, i \neq j}^{d_v - 1} u_i$$

And let message update on check nodes to be calculated as follows:

$$\tanh \frac{u_i}{2} = \sum_{j=0, j \neq i}^{d_c - 1} \tanh v_j$$

Wherein $v_j$ denotes variable node to check node messages, $u_{ch}$ denotes channel information, $u_i$ denotes check node to variable node messages, $d_v$ denotes variable degree, and $d_c$ denotes check degree.

Furthermore, the total LLR excluding channel a priori LLR can be used inside the decoder as the estimation of the channel a priori LLR, calculated as follows:

$$\hat{C} = \left| \sum_{i=0}^{d_v - 1} u_i \right|$$

Wherein $\hat{C}$ is obtained after several decoding iterations. Noted that $\hat{C}$ is bit-based, i.e., each bit will have its own estimation of $\hat{C}$. Once the values of $\hat{C}$ for each bit is calculated (e.g., after the first several iterations), the input LLR to the decoder is set to be $+\hat{C}$ for hard decision=1 and $-\hat{C}$ for hard decision=0 in the following iterations. In one embodiment, up to a predetermined number of local decoding iterations are utilized to obtain the $\hat{C}$ values. It is contemplated that the specific number of local decoding iterations may vary without departing from the spirit and scope of the present disclosure.

It is also contemplated that the improvement provided by the bit-based C values calculated as described above may be limited when the hard decision is in error. This is because the bit-based C values calculated as described above only take into consideration the estimation of amplitude. The sign of LLR can still be in error for some bits with high noise levels.

To compensate for such hard decision errors, in certain embodiments, a reliability sorting technique is utilized starting at the end of the second local iteration to erase channel LLR on the least reliable bits. More specifically, the amplitude of channel likelihood ratio can be estimated after a few iterations by calculating $\hat{C} = |\Sigma_{i=0}^{d_v-1} u_i|$ for every bit. The calculated values can be sorted and channel LLR on the least reliable bit(s) can be erased by setting $\hat{C}=0$ on the least reliable bit(s). This makes the least reliable bit(s) function as erasures and avoids performance degradations caused by hard decision errors. It is contemplated that up to a few least reliable bits can be erased in this manner without departing from the spirit and scope of the present disclosure.

Figure 3:
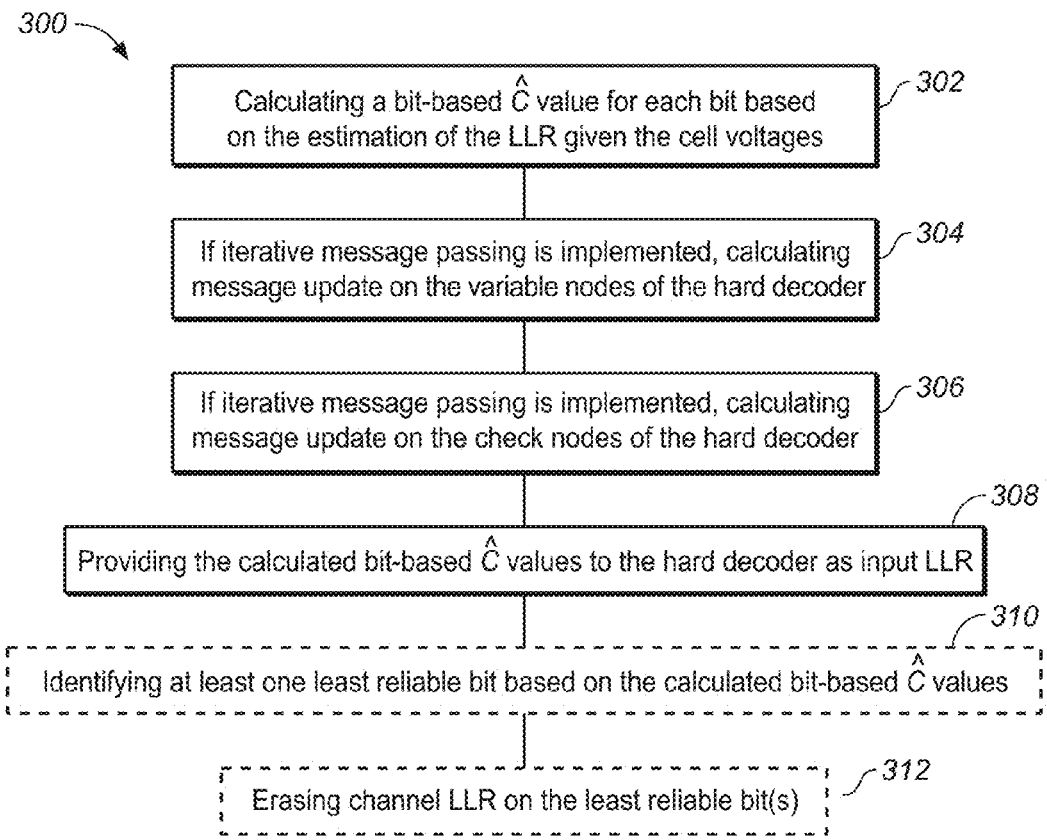
FIG. 3 is a flow diagram illustrating a method for providing bit-based input LLR to a hard decoder of a flash channel.

Referring now to FIG. 3, a flow diagram illustrating a method 300 for providing bit-based input LLR to a hard decoder of a flash channel is shown. As described above, this method 300 can be invoked after at least one (and preferably after several) decoding iteration(s). That is, after waiting for the at least one decoding iteration, a bit-based $\hat{C}$ value is calculated for each bit based on the estimation of the LLR given the cell voltages in step 302. In one embodiment, the $\hat{C}$ value for each bit is calculated as $\hat{C}=|\Sigma_{i=0}^{d_v-1} u_i|$. In addition, the message update on the variable nodes of the hard decoder is calculated as $v_j = u_{ch} + \Sigma_{i=0, i \neq j}^{d_v-1} u_i$ in step 304, and the message update on the check nodes of the hard decoder is calculated as $$\tanh \frac{u_i}{2} = \sum_{j=0, j \neq i}^{d_c-1}$$

tan h $v_j$ in step 306. It is contemplated that steps 302, 302 and 306 can be carried out simultaneously or in various orders as permitted by available processing power. Once the $\hat{C}$ value for each bit is calculated, the input LLR to the hard decoder is set to be $+\hat{C}$ for hard decision=1 and $-\hat{C}$ for hard decision=0 in step 308 for the subsequent iterations.

In addition to the steps described above, a reliability checking process can be carried out starting at the end of the second local iteration to erase channel LLR on the least reliable bits. As shown in FIG. 3, the least reliable bit(s) can be identified based on their corresponding $\hat{C}$ values in step 310 and channel LLR on the least reliable bit(s) can be erased by setting $\hat{C}=0$ on the least reliable bit(s) in step 312. This reliability checking process makes the least reliable bit(s) function as erasures and avoids performance degradations caused by hard decision errors. It is contemplated, however, that steps 310 and 312 can be configured as optional steps.

It is also contemplated that the C value calculation techniques described above can be used for handling input LLR values to any decoders (e.g., including soft and hard decoders) in SLC, MLC and TLC flash memories. While these techniques are particularly beneficial when used for hard decoders for flash channels with LDPC decoding, they are also applicable to other decoders without departing from the spirit and scope of the present disclosure.

Figure 4:
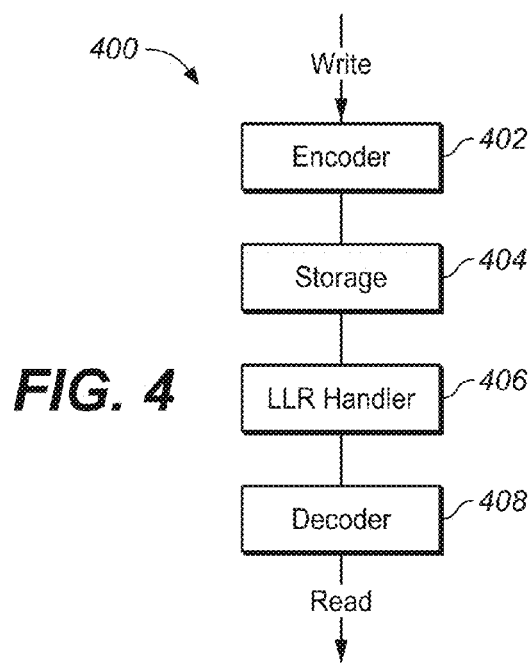
FIG. 4 is a block diagram depicting an electronic non-volatile computer storage apparatus utilizing the LLR handling techniques in accordance with embodiments of the present disclosure.

Referring now to FIG. 4, a block diagram depicting an electronic non-volatile computer storage apparatus 400 (e.g., a flash memory) utilizing the LLR handling techniques described above is shown. As illustrated in FIG. 4, the storage apparatus 400 includes an encoder (e.g., a LDPC encoder) 402 configured for encoding data written to the storage apparatus 400. The encoded data is stored in the storage module 404 that includes a number of memory cells. The storage apparatus 400 also includes a LLR handler 406 configured for handling input LLR values for a decoder (e.g., a LDPC decoder) 408 in order to improve its performance. In one embodiment, the LLR handler 406 utilizes a processor to calculate the C values utilizing method 200 and/or method 300 as described above.

It is contemplated that while flash memories are described above as an exemplary electronic non-volatile computer storage apparatus, the techniques disclosed in the present disclosure are applicable to other types of electronic non-volatile computer storage apparatus that utilize one or more levels of electrical charge for data encoding, decoding and storage without departing from the spirit and scope of the present disclosure.

It is also contemplated that the decoding methods described above can be utilized in a solid state drive, a hybrid drive, or a part of a higher level system, such as a RAID (redundant array of inexpensive storage devices or redundant array of independent storage devices) based storage system that utilizes at least one electronic non-volatile computer storage device. Such a RAID storage system increases stability and reliability through redundancy, combining multiple storage devices as a logical unit. Data may be spread across a number of storage devices included in the RAID storage system according to a variety of algorithms and accessed by an operating system as if it were a single storage devices. For example, data may be mirrored to multiple storage devices in the RAID storage system, or may be sliced and distributed across multiple storage devices in a number of techniques. If a small number of storage devices in the RAID storage system fail or become unavailable, error correction techniques may be used to recreate the missing data based on the remaining portions of the data from the other storage devices in the RAID storage system. The storage devices in the RAID storage system may be, but are not limited to, individual storage systems such hard disk drives, solid state drives, hybrid drives or any combination of such drives, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

As mentioned previously, the storage device configuration can be varied in other embodiments of the invention. For example, the storage device may comprise a hybrid hard disk drive which includes a flash memory in addition to one or more storage disks. In addition, storage device may be coupled to or incorporated within a host processing device, which may be a computer, server, communication device, etc.

Furthermore, multiple storage devices possibly of various different types may be incorporated into a virtual storage system. The virtual storage system, also referred to as a storage virtualization system, may include a virtual storage controller coupled to a RAID system. One or more of the storage devices of the RAID system are assumed to be configured to include electronic non-volatile computer storage devices such as flash memories. These and other virtual storage systems comprising at least one electronic non-volatile computer storage device such as a flash memory are considered embodiments of the invention.

Embodiments of the invention may also be implemented in the form of integrated circuits. In a given such integrated circuit implementation, identical die are typically formed in a repeated pattern on a surface of a semiconductor wafer. Each die includes, for example, at least a portion of decoding circuitry as described herein, and may further include other structures or circuits. The individual die are cut or diced from the wafer, then packaged as an integrated circuit. One skilled in the art would know how to dice wafers and package die to produce integrated circuits. Integrated circuits so manufactured are considered embodiments of the invention.

It should again be emphasized that the above-described embodiments of the invention are intended to be illustrative only. For example, other embodiments can use different types and arrangements of storage disks, read/write heads, read channel circuitry, signal processing circuitry, decoders, filters, detectors, and other storage device elements for implementing the described error correction functionality. Also, the particular manner in which certain steps are performed in the signal processing may vary. Further, although embodiments of the invention have been described with respect to storage disks such as hard disk drives, embodiments of the invention may be implemented various other devices including optical data-storage applications and wireless communications. These and numerous other alternative embodiments within the scope of the following claims will be apparent to those skilled in the art.

Furthermore, embodiments of the invention are applicable to any communication channel that employs low density parity check technology (LDPC). LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes, optical data-storage, and memory devices such as DRAM, NAND flash, NOR flash, other non-volatile memories, solid state drives, and hybrid drives.

It is to be understood that the present disclosure may be conveniently implemented in forms of a software, hardware or firmware package. Such a package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for providing an input log-likelihood ratio to a decoder of an electronic non-volatile computer storage apparatus, comprising:
    estimating a raw bit error rate for a particular data unit;
    calculating an input log-likelihood ratio based on a ratio of the estimated raw bit error rate (BER) to (1−BER); and
    providing the calculated input log-likelihood ratio to a decoder of an electronic non-volatile computer storage apparatus for decoding data from that particular data unit.

2. The method of claim 1, wherein the raw bit error rate is estimated by comparing converged data with channel observations for that particular data unit.

3. The method of claim 1, wherein the input log-likelihood ratio is calculated as $$\log \frac{BER}{1-BER}.$$

4. The method of claim 3, wherein the decoder passes $$\log \frac{BER}{1-BER}$$

for 0 and passes $$-\log \frac{BER}{1-BER}$$

for 1.

5. The method of claim 1, wherein the raw bit error rate is estimated for each data unit being decoded, wherein the data unit being one of: a line, a page and a block.

6. The method of claim 1, wherein the decoder is a belief-propagation decoder.

7. A method, comprising:
    waiting for at least one decoding iteration;
    after said at least one decoding iteration, calculating a bit-based input log-likelihood ratio for each bit based on a confidence value for a cell containing said each bit; and
    providing the calculated bit-based input log-likelihood ratio for each bit to a decoder of an electronic non-volatile computer storage apparatus for a subsequent decoding iteration.

8. The method of claim 7, wherein the bit-based input log-likelihood ratio for each bit is calculated as $$\hat{c} = \left| \sum_{i=0}^{d_v-1} u_i \right|,$$

wherein $u_i$ denotes check node to variable node messages and $d_v$ denotes a variable degree.

9. The method of claim 8, wherein the decoder passes $+\hat{C}$ for 1 and passes $-\hat{C}$ for 0.

10. The method of claim 8, wherein the decoder implements iterative message passing, wherein message update on variable nodes of the decoder is calculated as $$v_j = u_{ch} + \sum_{i=0, i \neq j}^{d_v - 1} u_i$$

and message update on check nodes of the decoder is calculated as $$\tanh \frac{u_i}{2} = \sum_{j=0, j \neq i}^{d_c - 1}$$

tan h $v_j$, wherein $v_j$ denotes variable node to check node messages, $u_{ch}$ denotes channel information, $u_i$ denotes check node to variable node messages, $d_v$ denotes a variable degree, and $d_c$ denotes a check degree.

11. The method of claim 8, further comprising:
    identifying at least one least reliable bit based on the calculated bit-based input log-likelihood ratio for each bit; and
    setting the bit-based input log-likelihood ratio for at least one least reliable bit to 0 prior to providing the bit-based input log-likelihood ratio to the decoder.

12. The method of claim 8, wherein the decoder is a belief-propagation decoder or a min-sum decoder.

13. An electronic non-volatile computer storage apparatus, comprising:
    an encoder configured to encode data written to the electronic non-volatile computer storage apparatus;
    a storage module configured to store encoded data from the encoder;
    a log-likelihood ratio handler configured to provide an input log-likelihood ratio to a decoder, wherein the input log-likelihood ratio is at least one of:
        a uniform input log-likelihood ratio for all bits calculated based on a ratio of an estimated raw bit error rate (BER) to (1−BER) for a particular data unit, and
        a bit-based input log-likelihood ratio for each bit calculated based on a confidence value for a cell containing said each bit; and
    the decoder configured to decode the encoded data at least partially based on the input log-likelihood ratio from the log-likelihood ratio handler.

14. The electronic non-volatile computer storage apparatus of claim 13, wherein the log-likelihood ratio handler is configured to provide the uniform input log-likelihood ratio for all bits calculated based on the estimated raw bit error rate for said particular data unit, and wherein the raw bit error rate is estimated by comparing converged data with channel observations for that particular data unit.

15. The electronic non-volatile computer storage apparatus of claim 14, wherein the input log-likelihood ratio is calculated as $$\log \frac{BER}{1 - BER}.$$

16. The electronic non-volatile computer storage apparatus of claim 15, wherein the decoder passes $$\log \frac{BER}{1 - BER}$$

for 0 and passes $$-\log \frac{BER}{1 - BER}$$

for 1.

17. The electronic non-volatile computer storage apparatus of claim 16, wherein the decoder is a belief-propagation decoder.

18. The electronic non-volatile computer storage apparatus of claim 13, wherein the log-likelihood ratio handler is configured to provide the bit-based input log-likelihood ratio for each bit calculated based on the confidence value for the cell containing said each bit, and wherein the bit-based input log-likelihood ratio for each bit is calculated as $$\hat{C} = \left| \sum_{i=0}^{d_v - 1} u_i \right|,$$

wherein $u_i$ denotes check node to variable node messages and $d_v$ denotes a variable degree.

19. The electronic non-volatile computer storage apparatus of claim 18, wherein the decoder passes $+\hat{C}$ for 1 and passes $-\hat{C}$ for 0.

20. The electronic non-volatile computer storage apparatus of claim 18, wherein the log-likelihood ratio handler is configured to set the bit-based input log-likelihood ratio for at least one least reliable bit to 0.

\* \* \* \* \*